(12) United States Patent
Koning et al.

(10) Patent No.: US 7,816,171 B2
(45) Date of Patent: Oct. 19, 2010

(54) COMPONENT PACKAGING APPARATUS, SYSTEMS, AND METHODS

(75) Inventors: Paul A. Koning, Chandler, AZ (US); James C. Matayabas, Jr., Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 322 days.

(21) Appl. No.: 11/866,795

(22) Filed: Oct. 3, 2007

(65) Prior Publication Data

US 2008/0023817 A1 Jan. 31, 2008

Related U.S. Application Data

(62) Division of application No. 10/750,459, filed on Dec. 31, 2003, now Pat. No. 7,365,414.

(60) Provisional application No. 60/525,935, filed on Dec. 1, 2003.

(51) Int. Cl.
*H01L 21/00* (2006.01)

(52) U.S. Cl. .................. 438/82; 438/725; 438/780; 257/642; 257/643

(58) Field of Classification Search .............. 438/82, 438/725, 780; 257/40, 642, 643
See application file for complete search history.

(56) References Cited

U.S. PATENT DOCUMENTS

| 4,474,920 | A * | 10/1984 | Kyminas et al. | ............ 524/386 |
| 4,723,903 | A | 2/1988 | Okazaki et al. | |
| 5,534,593 | A | 7/1996 | Friedman | |
| 6,030,556 | A | 2/2000 | DePuydt et al. | |
| 6,030,692 | A | 2/2000 | Auger et al. | |
| 6,210,514 | B1 | 4/2001 | Cheung et al. | |
| 6,454,970 | B1 | 9/2002 | Ohman et al. | |
| 6,784,376 | B1 * | 8/2004 | Huemoeller et al. | ........ 174/262 |
| 6,869,557 | B1 | 3/2005 | Wago et al. | |
| 2004/0126547 | A1 * | 7/2004 | Coomer | ...................... 428/209 |
| 2004/0202865 | A1 | 10/2004 | Homola et al. | |
| 2005/0020803 | A1 * | 1/2005 | Machida et al. | ............. 528/196 |
| 2005/0116299 | A1 | 6/2005 | Koning et al. | |
| 2005/0116387 | A1 | 6/2005 | Davison et al. | |
| 2006/0051453 | A1 | 3/2006 | Imatomi | |

OTHER PUBLICATIONS

"Light Duty : Managing MOEMS", www.stcsm.gov.cn,(Jul. 19, 2001).
"U.S. Appl. No. 10/750,459 Non-Final Office Action mailed Apr. 19, 2006", 13 pgs.
"U.S. Appl. No. 10/750,459 Notice of Allowance mailed Jul. 5, 2007", 10 pgs.
"U.S. Appl. No. 10/750,459 Response filed Jul. 21, 2006 in response to Non-Final Office Action mailed Apr. 19, 2006", 9 pgs.
"U.S. Appl. No. 10/750,534 Final Office Action mailed Dec. 13, 2006", 14 pgs.

(Continued)

*Primary Examiner*—Thinh T Nguyen
(74) *Attorney, Agent, or Firm*—John N. Greaves

(57) ABSTRACT

Dielectric materials comprising release agents are described. Also described are a process for improving the processability of dielectric materials during hot embossing, substrates prepared by hot embossing, and integrated-circuit packages comprising the improved substrate.

5 Claims, 6 Drawing Sheets

OTHER PUBLICATIONS

"U.S. Appl. No. 10/750,534 Non-final office action mailed May 9, 2006", 16 pgs.

"U.S. Appl. No. 10/750,534 Non-Final Office Action mailed Aug. 21, 2007", OARN,17 Pages.

"U.S. Appl. No. 10/750,534 Response filed Mar. 2, 2007 in response to Final Office Action mailed Dec. 13, 2006", 9 pgs.

"U.S. Appl. No. 10/750,534 Response filed Oct. 10, 2006 to non-final office action mailed May 9, 2006", 12 pgs.

* cited by examiner

COMPONENT PACKAGING APPARATUS, SYSTEMS, AND METHODS

PRIORITY CLAIM

This application is a divisional of U.S. patent application Ser. No. 10/750,459, filed Dec. 31, 2003 now U.S. Pat. No. 7,365,414, which claims the benefit of priority under 35 U.S.C. 119(e) to U.S. Provisional Patent Application Ser. No. 60/525,935, filed on Dec. 1, 2003, both of which are incorporated herein by reference.

RELATED APPLICATION

This disclosure is related to pending U.S. patent application Ser. No. 10/750,534, titled "Component Packaging Apparatus, Systems and Methods," by Peter A. Davison and Paul A. Koning, filed on Dec. 31, 2003, and is assigned to the assignee of the embodiments disclosed herein, Intel Corporation.

TECHNICAL FIELD

Various embodiments described herein relate to component packaging generally, including apparatus, systems, and methods used for integrated circuit packages.

BACKGROUND INFORMATION

Electronic chips typically need to be packaged in a package that provides an electric circuit between each electrical connection from the chip and an external connector such as a pin or a ball extending from the package to external circuitry such as a printed-circuit board. The circuitry on the chip, particularly a very fast chip such as a microprocessor, generates a considerable amount of heat. Typically, the circuitry and electrical connections for a chip are provided on one face of the chip. Sometimes, the majority of heat is removed from the opposite face of the chip.

The circuit side of the chip typically provides pads that are connected to the chip's packaging using, for example, solder-ball connections, which provide connections for electrical power and for input-output signals. The opposite, or back, side of the chip can have a heatsink or other heat-removing device attached, providing heat elimination. For some systems, a thermal-interface material (TIM) is used to attach a heat spreader to the back of an IC chip. In some systems a second thermal-interface material is used to attach a heat sink to the heat spreader.

A package for a chip or chips typically has a non-conductive substrate (such as a plastic film or layer, or a ceramic layer) with conductive traces above a surface of the substrate. Package wiring is becoming smaller, multilayered, and denser. Either solder-ball connections or wirebonds connect a chip to the package. Some packages include multiple chips, such as one or more logic or processor chips, one or more communications chips (such as for a cell phone or wireless LAN), and/or one or more memory chips, such as DDR RAMs (double-data-rate random-access memories, which are typically volatile and lose their contents when power is removed) and/or a FLASH-type reprogrammable non-volatile memory. Optionally, a cover or encapsulant is used to enclose parts or all of the chip or chips.

DETAILED DESCRIPTION

Figure 1:
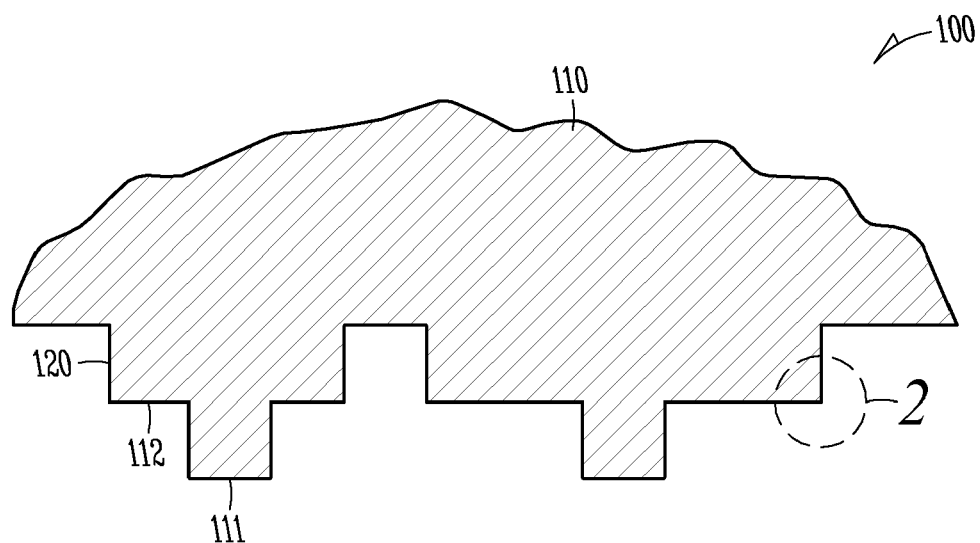
FIG. 1 is a cross-section schematic view of a portion of an imprinting foil 100.

In the following detailed description of the various embodiments, reference is made to the accompanying drawings that form a part hereof, and in which are shown by way of illustration some exemplary embodiments in which the subject matter may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. The same reference number or label may refer to signals and connections, and the actual meaning will be clear from its use in the context of the description.

Terminology

The terms chip, die, integrated circuit, monolithic device, semiconductor device, and microelectronic device, are used interchangeably in this description.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally copper (Cu) or an alloy of Cu and another metal such as nickel (Ni), aluminum (Al), titanium (Ti), molybdenum (Mo), or stacked layers of different metals, alloys or other combinations, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

In this description, the term metal applies both to substantially pure single metallic elements and to alloys or combinations of two or more elements, at least one of which is a metallic element.

The terms substrate or core generally refer to the physical structure or layer that is the basic workpiece that is transformed by various process operations into the desired microelectronic configuration. Substrates may include conducting material (such as copper or aluminum), insulating material (such as sapphire, ceramic, or plastic), semiconducting materials (such as silicon), non-semiconducting materials, or combinations of semiconducting and non-semiconducting materials. In some embodiments, substrates include layered structures, such as a core sheet or piece of material (such as iron-nickel alloy) chosen for its a coefficient of thermal expansion (CTE) that more closely matches the CTE of an adjacent structure such as a silicon processor chip. In some embodiments, such a substrate core is laminated to a sheet of material chosen for electrical and/or thermal conductivity (such as a copper or aluminum alloy), which in turn is covered with a layer of plastic chosen for electrical insulation, stability, and embossing characteristics. In some embodiments, the plastic layer has wiring traces that carry signals and electrical power horizontally (i.e., parallel to the major surface), and vias that carry signals and electrical power vertically (i.e., perpendicular to the major surface) between layers of traces.

The term vertical is defined to mean substantially perpendicular to the major surface of a substrate, while the term horizontal is defined to mean substantially parallel to the major surface of a substrate. Height or depth refers to a distance in a direction perpendicular to the major surface of a substrate.

Some embodiments include imprinting for making printed-circuit boards for substrates. In general it involves pressing a male-patterned tool foil (also known as a micro-tool) into a softened dielectric substrate material leaving behind the 3-D imprint (impression) of a pattern for the lines, traces and vias in the dielectric material. The foil can be made, for example, by plating a suitably thick layer of nickel onto a photolithographically prepared master that defined the 3-D structure of the embossing surface. In some embodiments, the tool and/or the substrate are heated for the embossing process. Occasionally, the softened dielectric sticks on the surface and in the fine-line structures of the micro-tool. This causes serious degradation of the features quality and contamination of the tool, and reduces the yield of the imprinting process. In addition, the tool must be aligned to very close tolerances for successful formation of interconnects between layers. Any removal of the tool for cleaning would represent a significant reduction of Units Per Hour (UPH) for this process, since it must be carefully and painstakingly re-aligned before being brought back on-line. After much use, the tool wears, particularly at sharp edges, and then must be replaced. If a hardened surface is provided on the tool surface, the tool does not become worn as quickly as otherwise.

Some embodiments address the adhesion and wear problems by hardening the tool and drastically reducing or eliminating adhesion of the dielectric to the micro-tool. This solution is not merely a stand-alone solution to adhesion, but provides performance-improving synergistic relationships with release coatings on the dielectric or release agents inside the dielectric.

Some embodiments also relate to dielectric substrates that are embossed with a micro-tool pattern that defines where metal lines for signal and/or power conductors are to be formed in subsequent steps. For example, a plurality of grooves, and/or via holes to underlying layers, are simultaneously embossed in a hot process, and these grooves are then filled with metal, such as copper or a copper alloy, to form a wiring pattern for an electronic circuit, e.g., to connect a microprocessor chip, and/or other chips such as memory chips, to external circuitry.

When adhesion or contamination of the embossing foil occurs, the micro-tool typically must be removed from the imprinting press and cleaned in aggressive solvent with ultrasonic agitation. The tool is then reinstalled and realigned in the imprinting press, taking time and reducing UPH throughput.

Reducing adhesion, preventing contamination, and increasing the time between tool cleaning each increase the yield at the imprinting step and increase UPH by eliminating tool re-alignment procedures that must otherwise be performed.

Some embodiments include coating the embossing foil with a metal/metal-nitride/metal-oxide triple coat (in some embodiments, this metal is zirconium, Zr), and a conformal anti-stick polymer coating (e.g., Parylene Nova HT). Parylene Nova HT material has been used to reduce the coefficient of friction in MEMS (Micro Electro-Mechanical System) devices. Parylene Nova HT is a high-temperature performance product. The Zr/ZrN/ZrO triple coat prepares the nickel tool to have considerably improved adhesion to the Parylene coating. In addition, the Zr/ZrN/ZrO triple coat increases the surface hardness of the tool to 85 Rockwell hardness and reduces flaking and/or pealing since, in some embodiments, the first layer (i.e., the Zr layer) is fused into the free spaces in the nickel tool to a 0.5-micron depth with a 0.5-micron build up.

In some embodiments, adding a high-hardness, low-coefficient-of-friction coating to the surface of the tool minimizes or eliminates the adhesion problems with the micro-tool. All of the coatings can be deposited very thin (in some embodiments, the Zr/ZrN/ZrO triple coat is in 0.5-micron, 0.5-micron, and 0.5-micron respective thicknesses and the Parylene Nova HT in 2-micron to 9-micron thickness). The polymer top coating and the triple-coat sub-coating are both conformal to the surface of the tool and embodiments of the combined coating meet the following goals:

No bonding with epoxy-type materials,

Thermally resistant to high temperatures, e.g., 175-225 degrees C.,

Chemically inert to Polar Solvents (Acetone, MEK, NMP, or DMAC),

Permanent adhesion to the nickel tool (facilitated by the Zr/ZrN/ZrO triple coat), Excellent abrasion resistance (in some embodiments, the Zr/ZrN/ZrO is 85 Rockwell Hardness), and Conformal coating with the ability of being applied in micron and sub-micron thickness.

FIG. 1 is a cross-section schematic view of a portion of a micro-tool imprinting foil 100. In some embodiments, foil 100 includes a substrate (e.g., nickel) formed with an embossing surface pattern having a coating 120 over the substrate base. In some embodiments, the projections extend to a plurality of depths, such that the furthest projections 111 will extend through or nearly through a thin top layer of dielectric, providing contact points to underlying layers, while the intermediate level projections 112 provide the definition of wiring channels along that layer of dielectric. The corner within circle 2 is shown in close-up in FIG. 2.

Figure 2:
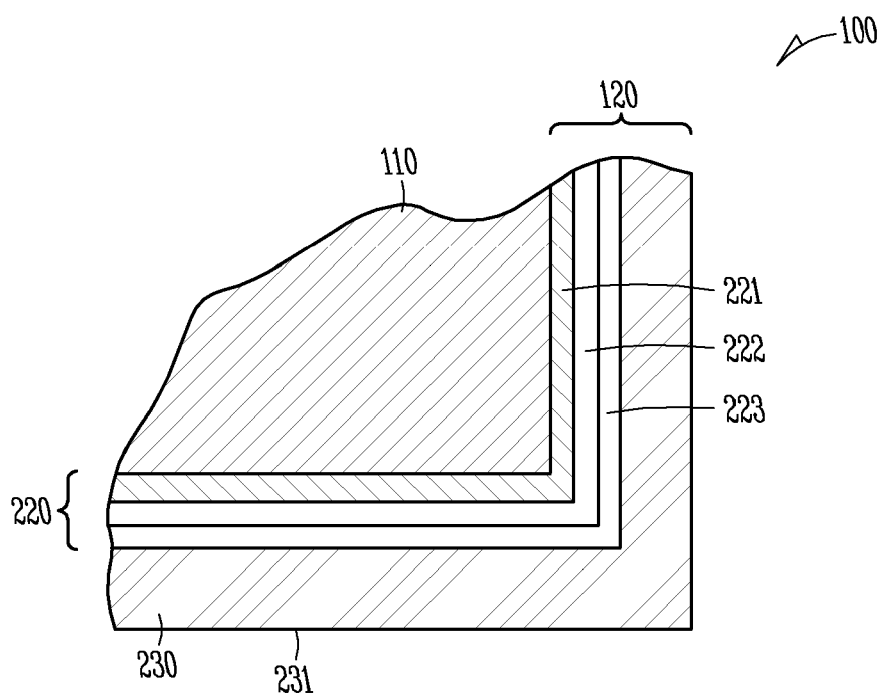
FIG. 2 is a close-up cross-section schematic view of a portion of imprinting foil 100.

FIG. 2 is a close-up cross-section schematic view of a portion of imprinting foil 100. Substrate base 110 has a coating 120 over it that, in some embodiments, includes a metal/metal-nitride/metal-oxide triple coat (in some embodiments, this metal is zirconium, Zr, with zirconium layer 221 on and/or at least partially diffused into the surface of nickle substrate 110, then zirconium oxide layer 222, and zirconium nitride layer 223), and a conformal coating 230 (e.g., in some embodiments, Parylene Nova HT-brand poly-para-xylylene) having an anti-stick surface 231. In some embodiments, zirconium layer 221 is fused into the free spaces in the nickel tool substrate to about a 0.5-micron depth with a 0.5-micron build up. In other embodiments, other thicknesses (for example, 0.1 micron, 0.2 micron, 0.3 micron, 0.4 micron, 0.6 micron, 0.7 micron, 0.8 micron, 0.9 micron, 1.0 micron, or greater than 1.0 micron) and fuse depths (for example, 0.1 micron, 0.2 micron, 0.3 micron, 0.4 micron, 0.6 micron, 0.7 micron, 0.8 micron, 0.9 micron, 1.0 micron, or greater than 1.0 micron) are used. In some embodiments, zirconium oxide layer 222 is deposited to about a 0.5-micron thickness, and zirconium nitride layer 223 is deposited to about a 0.5-micron thickness. In other embodiments, other thicknesses are used for each layer (for example, 0.1 micron, 0.2 micron, 0.3 micron, 0.4 micron, 0.6 micron, 0.7 micron, 0.8 micron, 0.9 micron, 1.0 micron, or greater than 1.0 micron). In some embodiments, different thicknesses are used for the different components of the triple coat. In some embodiments, only two hard-coat parts are used, e.g., Zr/ZrO, Zr/ZrN, or ZrO/ZrN, rather than the triple coat. In some embodiments, each layer of the triple coat provides improved adhesion to the neighboring layers, as compared to trying to adhere the non-stick Parylene layer 230 directly to the substrate 110. In some embodiments, a polymer other than Paralene is used, such as other poly-para-xylylenes, polyethelene, PFA (Per Fluor Alkoxy), PTFE (poly-tetra-fluoro-ethylene), FEP (Fluoro Ethylene Propylene), ETFE (Ethylene Tetra Fluoro Ethylene Copolymer), ETFE (Ethylene Tetra Fluoro Ethylene Copolymer), PVDF (Poly Vinylidene Fluoride), or other suitable polymer.

Figure 3:
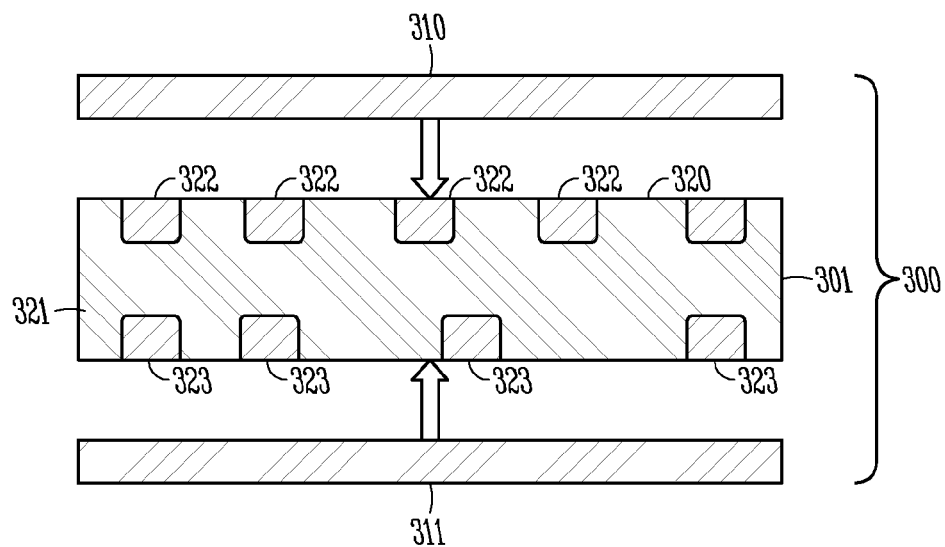
FIG. 3 is a cross-section schematic view of a substrate 300.

FIG. 3 is a cross-section schematic view of a substrate 300. In some embodiments, substrate core 320 is the result of previous embossing, plating and etching processes such as will be described below. In some embodiments, core 320 includes a dielectric substrate with a plurality of conductors (e.g., wires) 322 on one surface and conductors (e.g., wires) 323 on the opposite surface. In other embodiments, such wires are formed only on one surface. FIG. 3 shows a thin dielectric layer (310 or 311) being deposited or laminated on one or more surfaces of core 320, to form substrate 300, used in subsequent operations. In some embodiments, the dielectric laminate layers 310 and/or 311 are of a heat-activated epoxy resin. In some such embodiments, the epoxy resin includes a release agent, such as carnauba wax, mixed in, as described below.

Figure 4:
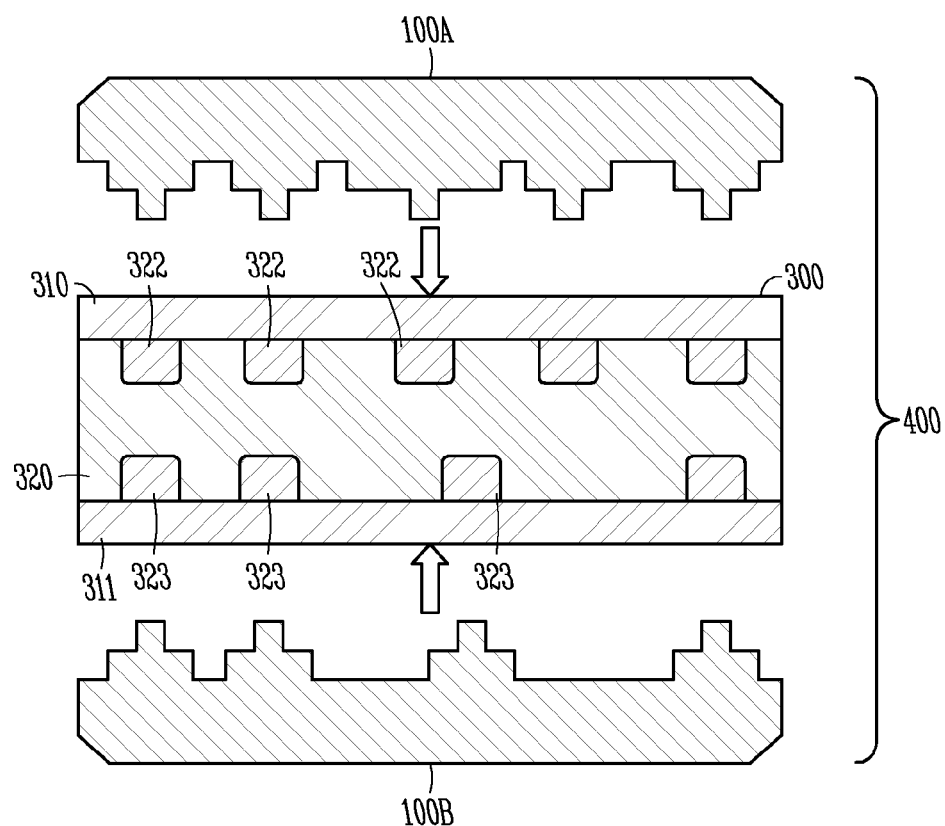
FIG. 4 is a cross-section schematic view of substrate 300 and imprinting foils 100.

FIG. 4 is a cross-section schematic view of substrate 300 and imprinting foils 100 just before contact between them. In some embodiments, substrate 300 includes core 320 and surface dielectric layers 310 and 311 over the core. In some embodiments, heated embossing foils 100A and 100B are impressed into layers 310 and 311, e.g., with foils 100A and 100B flat as shown, or as rollers with substrate 300 passing between the rollers.

Figure 5:
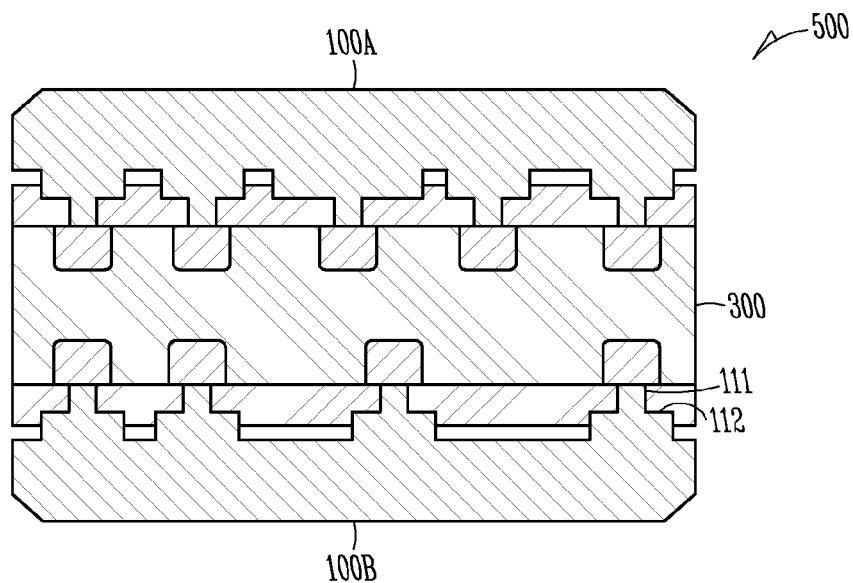
FIG. 5 is a cross-section schematic view of substrate 300 being embossed.

FIG. 5 is a cross-section schematic view of substrate 300 being embossed. In some embodiments, heat and/or pressure are applied during the embossing operation. In some embodiments, the projections 111 of foils 100A and 100B press through (or substantially through) layers 310 and 311 to (or nearly to) underlying conductors 322 and 323, while projections 112 form wiring channels in the outer portions of dielectric layers 310 and 311, which are separated from the underlying conductors.

Figure 6:
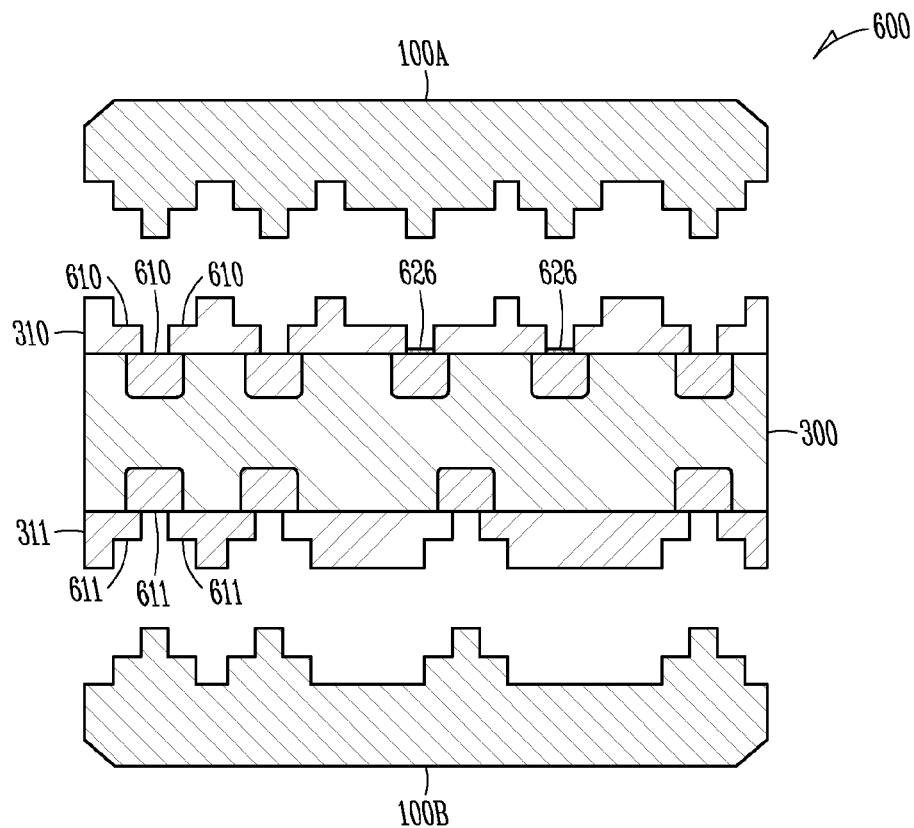
FIG. 6 is a cross-section schematic view of embossed substrate 600.

FIG. 6 is a cross-section schematic view of embossed substrate 600, as embossing foils 100A and 100B are being removed. Embossed substrate 600 includes substrate 300 with embossed patterns 610 and 611 left in layers 310 and 311, respectively. In other embodiments, as noted above, only a single surface (e.g., layer 310) is embossed at a time. In some embodiments, the embossed substrate 600 of FIG. 6 has an unwanted thin layer of dielectric material 626 in the bottom of each well that blocks or impedes contact to underlying conductors 322 and 323. In some embodiments, substrate 600 is heated for an extended period of time to harden its epoxy before proceeding to further operations.

Figure 7:
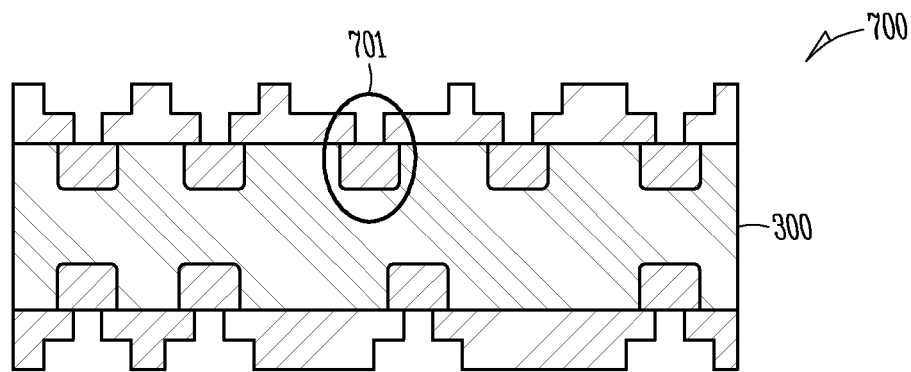
FIG. 7 is a cross-section schematic view of etched embossed substrate 700.

FIG. 7 is a cross-section schematic view of etched embossed substrate 700. In some embodiments, to remove the unwanted thin layer of dielectric material 626 in the bottom of each well, a brief plasma etch, reactive ion etch (RIE) or wet chemical etch is used to remove a shallow surface portion of dielectric layers 310 and 311, thus eliminating the unwanted thin layer of dielectric material 626 in the bottom of each well and opening a clean contact 701 in each deep well to the respective underlying conductors 322 and 323, while leaving substantially all of the remaining thicker portions of layers 310 and 311. In some embodiments, substrate 700 is heated after etching for an extended period of time to harden its epoxy before proceeding to further operations.

Figure 8:
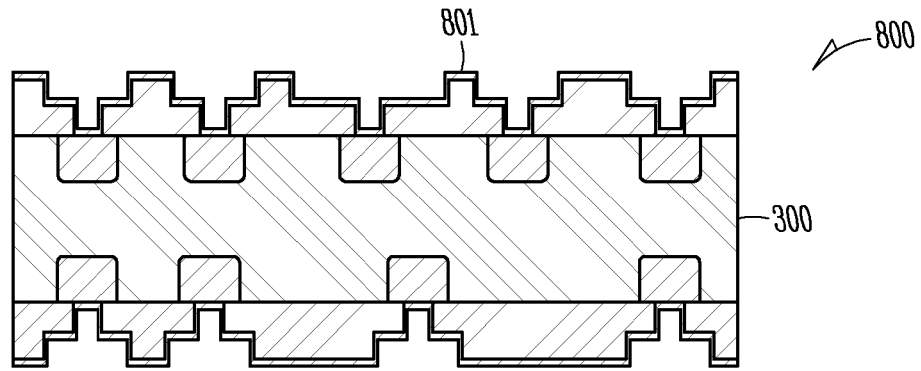
FIG. 8 is a cross-section schematic view of coated substrate 800.

FIG. 8 is a cross-section schematic view of coated substrate 800. In some embodiments, a thin conductive coating 801 is deposited (for example, such as by a plasma spray, chemical vapor deposition or by dipping into a solution of a nickel salt) over the outer surfaces of substrate 300 to form coated substrate 800.

Figure 9:
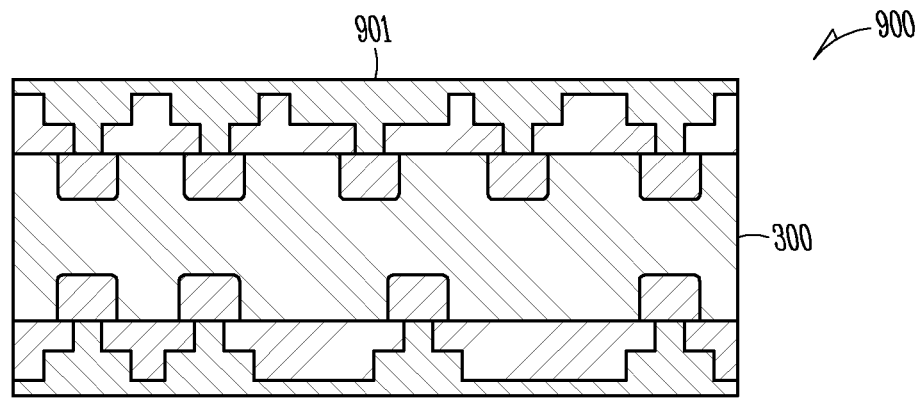
FIG. 9 is a cross-section schematic view of plated substrate 900.

FIG. 9 is a cross-section schematic view of plated substrate 900. In some embodiments, the conductive surface 801 is electroplated with a metal (such as copper or a copper alloy) layer 901 to a thickness sufficient to substantially fill all the embossed features.

Figure 10:
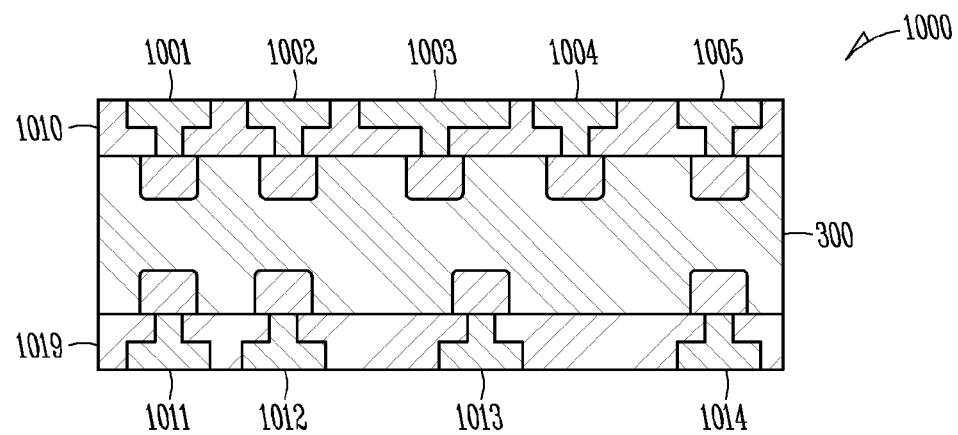
FIG. 10 is a cross-section schematic view of planarized substrate 1000.

FIG. 10 is a cross-section schematic view of planarized substrate 1000. In some embodiments, the top surface is planarized (for example, by mechanical or chemical-mechanical polishing) down to a point where the outermost portions of layer 901 are removed and the outermost portions of dielectric layers 310 and 311 are exposed, thus electrically isolating the individual traces 1001, 1002, 1003, 1004, 1005, etc., in top surface layer 1010, and traces 1011, 1012, 1013, 1014, 1015, etc., in bottom surface layer 1019.

In some embodiments, substrate 1000 is used as starting substrate base 301 for a subsequent deposition of one or more further layers of dielectric and conductive traces/wires on one or both major surfaces of the substrate.

Figure 11:
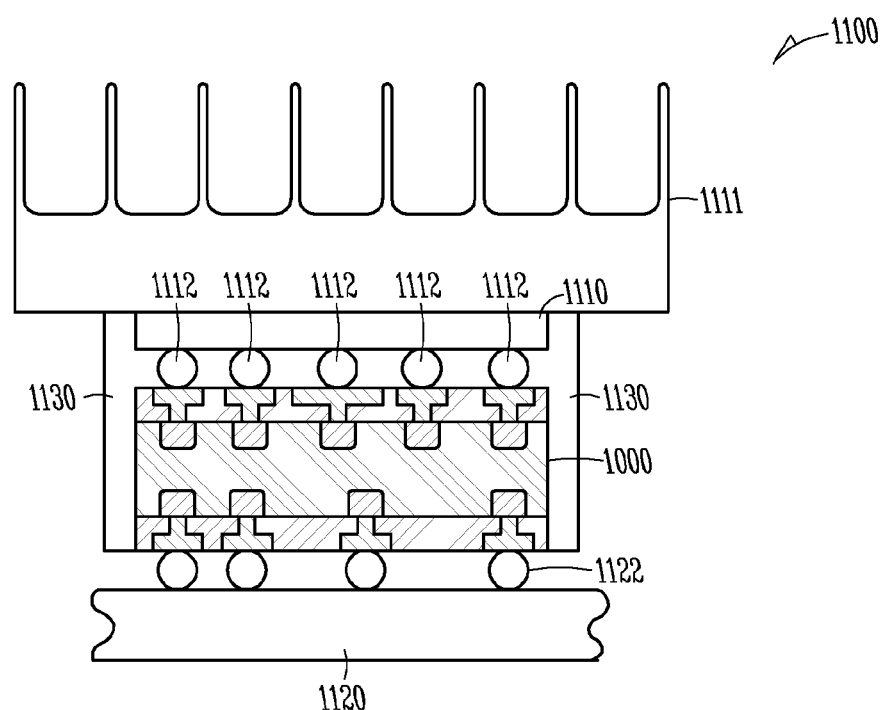
FIG. 11 is a cross-section schematic view of a packaged circuit 1100.

FIG. 11 is a cross-section schematic view of a packaged circuit 1100. In some embodiments, substrate 1000 (or a similar substrate that has been processed to have fewer or more wiring layers) is constructed into a packaged electronic component having one or more chips 1110, optionally a heat removal device 1111, and a set of external connectors 1122. In some embodiments, connectors 1112 (such as solder balls, for example) couple the one or more electronic chips 1110 to substrate 1000, and connectors 1122 (such as solder balls, for example) couple the substrate 1000 to external circuitry 1120 (such as a motherboard or flexible circuitry substrate)

Figure 12:
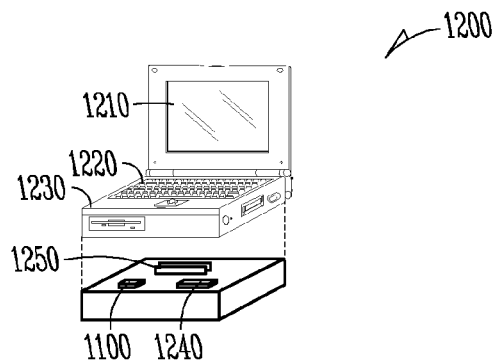
FIG. 12 is a perspective exploded view of computer system 1200 using circuit 1100.

FIG. 12 is a perspective exploded view of information-processing system 1200 using circuit 1100. For example, in various exemplary embodiments, information-processing system 1200 is a computer, workstation, server, supercomputer, cell phone, automobile, multimedia entertainment system, or other device. In some embodiments, packaged circuit 1100 includes a computer processor that is connected to memory 1250, power supply 1240, input system 1220 (such as a keyboard, mouse, and/or voice recognition apparatus), output system 1210 (such as a display, printer, and/or audio output apparatus), and packaged within enclosure 1230.

During the hot-embossing operations of FIGS. 3-10, it is observed that any adhesion of epoxy dielectrics to the micro-tools 100A and 100B causes serious degradation of the quality of the imprinted features, reduction in product yield, and contamination of the micro-tool 100 (e.g., tool foils 100A and 100B). The tools 100A and/or 100B are aligned to very close tolerances for successful formation of interconnects between layers, and any removal or disassembly the tool to clean dielectric-material residues from the tool results in significant reduction of units per hour (UPH) for this process, since the tool must be painstakingly re-aligned before being again brought on-line.

We have found that if the release agent is contained within the epoxy formulation (i.e., an internal release agent), then a fresh application is automatically "applied" with every dielectric layer brought into the imprinting press. In combination with surface treatment to the tool (such as the triple-coat and Parylene layers described above), undesired adhesion is essentially eliminated in some embodiments, thereby improving feature quality and yield. Also, by reducing adhesion and increasing the number of imprinting operations between tool cleaning, UPH is significantly increased.

Some embodiments provide release agents added to a dielectric polymer (e.g., an epoxy) mix. The release agents contained in the dielectric material provide improved features and decreased imprinting times (for higher UPH, or units per hour) by reducing adhesion of the dielectric material (e.g., layers 310 and 311) to the microtool(s) (e.g., tools 100A and 100B) during hot embossing.

In some embodiments internal release agents are useful for reducing adhesion of epoxy dielectric materials to imprinting micro-tools in an embossing process.

Dielectric epoxy resins typically contain epoxy resins, hardening agents, catalysts, and/or other additives such as fillers, defoamers, adhesion promoters, colorants, and the like. Examples of useful epoxy resins include the wide variety of known diglycidyl bisphenols, epoxylated novolak resins, and the like, or their mixtures. Examples of useful hardening agents include a wide variety of known bisphenols, novolak resins, and the like, or their mixtures. Examples of useful fillers include silica, silicates, aluminum oxide, zinc oxide, antimony oxide, calcium carbonate, and the like, or their mixtures.

FIGS. 3-10 illustrate a schematic representation of the imprinting process for manufacturing substrates. In some embodiments, the processes include lamination of the dielectric material (layers 310 and/or 311), imprinting to transfer the pattern from the micro-tool (100A and/or 100B) to the dielectric material (layers 310 and/or 311), releasing the micro-tool (e.g., as in FIG. 6, which is the process during which reduction of adhesion of the dielectric material to the micro-tool is desired, plasma etching, copper plating, and then planarization. If desired, the process of FIGS. 3-10 is repeated to construct additional build-up layers.

In some embodiments, release agents function by migrating to the interface of the epoxy with the tool, and since the release material has low adhesion to the tool, adhesion of the layer 310 formulation to the tool 100A is reduced.

Examples of useful internal release agents include carnauba wax, montanic acid, stearic acid, myristic acid, fatty acid glycol esters (aka. polyethylene glycol esters, laurate ester, etc), microcrystalline waxes (also urethanized and oxidized wax), polyethylene waxes (also urethanized and oxidized wax), low molecular weight branched polyethylene (also oxidized), silicone and epoxy or amino functional polydimethylsiloxanes, and the like or their mixtures.

The following comparison of embodiments contrasts a substrate layer made from an epoxy mixture without release agents to a substrate layer made with an epoxy mixture with release agents.

TABLE 1

| Comparative sample w/o release agent. | Sample With Release Agent |
|---|---|
| 210 parts of methyl ethyl ketone, | 210 parts of methyl ethyl ketone, |
| 20 parts of digylcidyl Bisphenol-A, | 20 parts of digylcidyl Bisphenol-A, |
| 20 parts of tetrabromo Bisphenol-A, | 20 parts of tetrabromo Bisphenol-A, |
| 20 parts of ortho-cresol novolak epoxy resin (215 g/eq), | 20 parts of ortho-cresol novolak epoxy resin (215 g/eq), |
| 15 parts of epoxy-terminated polybutadiene rubber, | 15 parts of epoxy-terminated polybutadiene rubber, |
| 50 parts of brominated phenolic novolak resin, | 50 parts of brominated phenolic novolak resin, |
| 4 parts of 2,4-diamino-6-(2-methyl-1-imadizolylethyl)-1,3,5-triazine.isocyanuric acid adduct, and | 4 parts of 2,4-diamino-6-(2-methyl-1-imadizolylethyl)-1,3,5-triazine.isocyanuric acid adduct, |
| 11 parts of silica (maximum particle size of 5 microns) | 11 parts of silica (maximum particle size of 5 microns), and 1 part of carnauba wax |

For both cases, the ingredients are added to a planetary mixer, heated to about 80° C., and mixed at 50 rpm for about 1 hour. The epoxy mixture is then passed twice through a 3-roll mill at about 80° C.

Figure 13:
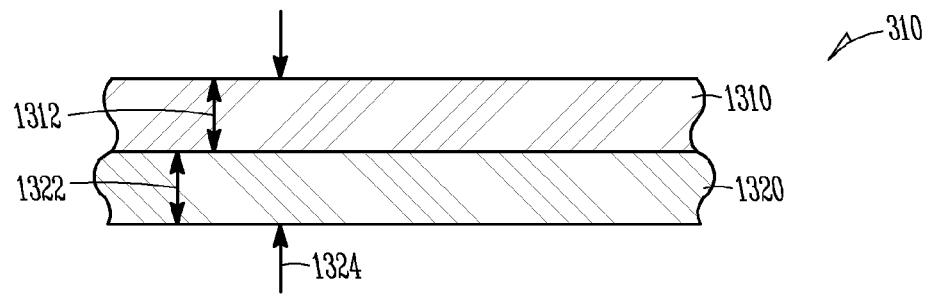
FIG. 13 is a cross-section schematic view of an exemplary dielectric film 310.

FIG. 13 is a cross-section schematic view of an exemplary dielectric film 310. The epoxy mixture is cast as a layer 1310 (of thickness 1312, e.g., about thirty-two microns, in some embodiments) onto Mylar intermediate film 1320 (of thickness 1322, e.g., about thirty-eight microns, in some embodiments) and dried at about 100° C. for 15 minutes to provide a total film thickness 1324 for layer 310 of about 70 microns, in some embodiments. The resulting film layer 310 (and/or layer 311) is then laminated onto a substrate base 301 as shown in FIG. 3 described above, by vacuum lamination at about 120° C., 1 MPa hydraulic pressure and 1 torr ambient pressure. The film layer 310 is imprinted at a pressure of 300 psi for about 1 to 5 minutes, during which time the temperature is rapidly ramped to 165° C. and then decreased to about 100° C., at which time the tool is released. Post imprinting, the film is cured at about 170° C. for 90 minutes.

For the Comparative Sample, microscopy and ellipsometry showed significantly worn features and cohesive damage, apparently due to too much adhesion of the dielectric material to the micro-tool.

For the Sample With the Release Agent, microscopy and ellipsometry showed significantly improved features and reduced cohesive damage as compared to the embodiment prepared as described in the Comparative Sample.

Figure 14:
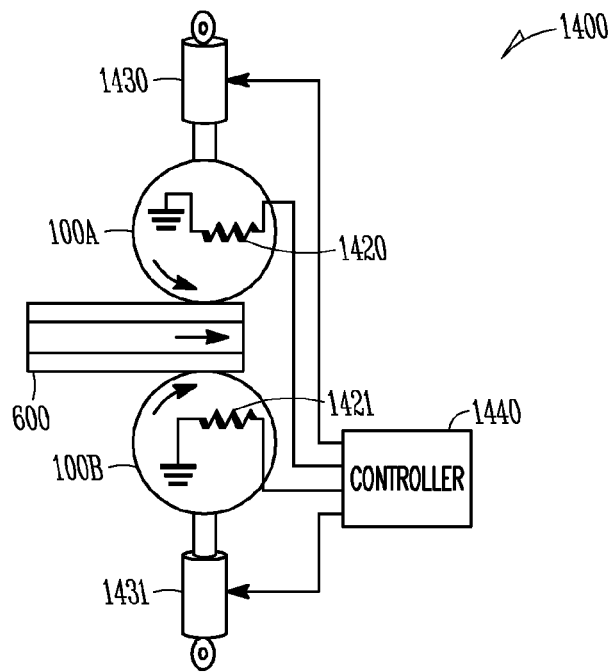
FIG. 14 is a side schematic view of an exemplary embossing machine 1400.

FIG. 14 is a side schematic view of an exemplary embossing machine 1400 having a top embossing roller 100A (heated by heater 1420 and pressed by pressure actuator 1430) and a bottom embossing roller 100B (heated by heater 1421 and pressed by pressure actuator 1431) both embossing substrate 600 that passes left-to-right between the rollers. In some embodiments, controller 1440 senses the heat and pressure, and sends control signals to heater 1420, pressure actuator 1430, heater 1421, and pressure actuator 1431, as well as to rotary motors that control the rotation of the rollers.

Some embodiments include an apparatus that includes an embossable substrate mixture 1310 that includes a polymer and a release agent. In some embodiments, the embossable substrate mixture 1310 is applied as a film (i.e., as a layer 310) directly over a substrate base 301, while in other embodiments, embossable substrate mixture 1310 is cast or otherwise deposited over an intermediate film 1320 to form a layer 310 over substrate base 301. In some embodiments layer 310 is attached to substrate base 301.

Some embodiments of the apparatus further include a substrate base 301, wherein the embossable substrate mixture 1310 forms a film 310 over the substrate base and is embossed.

In some embodiments, the embossable substrate mixture 1310 is formed as a film layer of suitable thickness 1312 over a Mylar film 1320 that is attached to the substrate base 301.

In some embodiments, the embossable substrate mixture polymer includes an epoxy resin, and a hardening agent.

In some embodiments, the release agent includes carnauba wax.

Some embodiments of the apparatus further include metal wiring 1001-1005 deposited in embossed grooves 610 of the embossable substrate mixture 1310, one or more electronic chips 1110 coupled to the metal wiring, and one or more external electrical connections 1122 coupled to the metal wiring. In some such embodiments, the one or more electronic chips 1110 coupled to the metal wiring include a computer processor. This apparatus further includes a memory 1250 operatively coupled to the processor, an input system 1220 and an output system 1210 operatively coupled to the processor, a power supply 1240 operatively coupled to the processor, and an enclosure 1230 holding the processor, the memory, the input system, the output system, and the power supply.

In some embodiments, the release agent includes one or more components selected from the group consisting of montanic acid, stearic acid, myristic acid, and combinations thereof.

In some embodiments, the release agent includes one or more components selected from the group consisting of fatty acid glycol esters, polyethylene glycol esters, laurate ester and combinations thereof.

In some embodiments, the release agent includes one or more components selected from the group consisting of microcrystalline wax, urethanized microcrystalline wax and oxidized microcrystalline wax and combinations thereof.

In some embodiments, the release agent includes one or more components selected from the group consisting of polyethylene waxes, urethanized polyethylene and oxidized polyethylene wax and combinations thereof.

In some embodiments, the release agent includes one or more components selected from the group consisting of low-molecular-weight branched polyethylene, oxidized low-molecular-weight branched polyethylene, silicone, amino functional polydimethylsiloxanes, and combinations thereof.

In some embodiments, the substrate mixture includes methyl ethyl ketone, digylcidyl Bisphenol-A, tetrabromo Bisphenol-A, ortho-cresol novolak epoxy resin, epoxy-terminated polybutadiene rubber, brominated phenolic novolak resin, 2,4-diamino-6-(2-methyl-1-imadizolylethyl)-1,3,5-triazine isocyanuric acid adduct, silica, and carnauba wax.

In some embodiments, the substrate mixture has a composition ratio of approximately: 210 parts of methyl ethyl ketone, 20 parts of digylcidyl Bisphenol-A, 20 parts of tetrabromo Bisphenol-A, 20 parts of ortho-cresol novolak epoxy resin (215 g/eq), 15 parts of epoxy-terminated polybutadiene rubber, 50 parts of brominated phenolic novolak resin, 4 parts of 2,4-diamino-6-(2-methyl-1-imadizolylethyl)-1,3,5-triazine.isocyanuric acid adduct, 11 parts of silica (maximum particle size of 5 microns), and 1 part of carnauba wax.

Some embodiments of the apparatus further include metal wiring deposited in embossed grooves of the embossed substrate mixture, one or more electronic chips coupled to the metal wiring, wherein the one or more electronic chips form a computer processor, one or more external electrical connections coupled to the metal wiring, a memory operatively coupled to the processor, an input system and an output system operatively coupled to the processor, a power supply operatively coupled to the processor, and an enclosure holding the processor, the memory, the input system, the output system, and the power supply.

Some embodiments provide a method that includes providing a substrate base 301, and depositing a film of an embossable mixture 1310 that includes a polymer and a release agent over the substrate base.

In some method embodiments, the depositing of the film includes forming a layer of the embossable mixture over a Mylar film, and attaching the Mylar film to the substrate base.

In some embodiments of the method, the providing of the embossable mixture includes mixing an epoxy resin and a hardening agent with the release agent.

In some embodiments of the method, the release agent includes carnauba wax.

Some embodiments of the method further include embossing a plurality of grooves into the embossable mixture layer, depositing metal into the embossed grooves, removing excess metal to leave wiring traces, attaching one or more electronic chips to the metal wiring, and attaching one or more external electrical connections to the metal wiring.

Some embodiments provide an apparatus including a substrate base 301, and means 310 as described above attached to the substrate base for providing an embossable surface with reduced adherence properties to an embossing tool 100.

In some embodiments, the means for providing the embossable surface includes a polymer film having attached thereto means for releasing the embossing tool mixed with an epoxy resin.

In some embodiments, the means for releasing the embossing tool includes carnauba wax.

In some embodiments, the means attached to the substrate base for providing the embossable surface is embossed, and the apparatus further includes metal wiring deposited in embossed grooves of the embossed surface, one or more electronic chips attached to the metal wiring, wherein the one or more electronic chips form a computer processor, one or more external electrical connections attached to the metal wiring, a memory operatively coupled to the processor, an input system and an output system operatively coupled to the processor, a power supply operatively coupled to the processor, and an enclosure holding the processor, the memory, the input system, the output system, and the power supply.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method comprising:
   providing a substrate base, wherein the providing of the embossable mixture comprises:
   mixing an epoxy resin and a hardening agent with the release agent; and
   depositing a film of an embossable mixture that includes a polymer and a release agent over the substrate base, wherein depositing the film includes depositing the release agent comprising carnauba wax, further comprising:
      embossing a plurality of grooves into the embossable mixture layer;
      depositing metal into the embossed grooves;
      removing excess metal to leave wiring traces;
      coupling one or more electronic chips to the metal wiring; and
      coupling one or more external electrical connections to the metal wiring,
      wherein depositing a film of an embossable mixture that includes depositing a mixture that comprises:
   methyl ethyl ketone;
   diglycidyl Bisphenol-A;
   tetrabromo Bisphenol-A;
   ortho-cresol novolak epoxy resin;
   epoxy-terminated polybutadiene rubber;
   brominated phenolic novolak resin;
   2,4-diamino-6-(2-methyl-1-imadizolylethyl)-1,3,5-triazine.isocyanuric acid adduct;
   silica; and
   carnauba wax.

2. The method of claim 1, wherein the depositing of the film includes forming a layer of the embossable mixture over a film, and attaching the film to the substrate base.

3. A method comprising:
   providing a substrate base; and
   depositing a film of an embossable mixture that includes a polymer and a release agent over the substrate base, wherein depositing a film of an embossable mixture that includes depositing a mixture that comprises:
   methyl ethyl ketone;
   diglycidyl Bisphenol-A;
   tetrabromo Bisphenol-A;
   ortho-cresol novolak epoxy resin;
   epoxy-terminated polybutadiene rubber;
   brominated phenolic novolak resin;
   2,4-diamino-6-(2-methyl-1-imadizolylethyl)-1,3,5-triazine.isocyanuric acid adduct;
   silica; and carnauba wax.

4. A method comprising:
   providing a substrate base; and
   depositing a film of an embossable mixture that includes a polymer and a release agent over the substrate base, wherein depositing a film of an embossable mixture that includes a composition ratio of approximately:
   210 parts of methyl ethyl ketone;
   20 parts of diglycidyl Bisphenol-A;
   20 parts of tetrabromo Bisphenol-A;
   20 parts of ortho-cresol novolak epoxy resin (215 g/eq);
   15 parts of epoxy-terminated polybutadiene rubber;
   50 parts of brominated phenolic novolak resin;
   4 parts of 2,4-diamino-6-(2-methyl-1-imadizolylethyl)-1,3,5-triazine.isocyanuric acid adduct;
   11 parts of silica (maximum particle size of 5 microns); and
   1 part of carnauba wax.

5. A method comprising:
   providing a substrate base, wherein the providing of the embossable mixture comprises mixing an epoxy resin and a hardening agent with the release agent;
   depositing a film of an embossable mixture that includes a polymer and a release agent over the substrate base, wherein depositing the film includes depositing the release agent comprising carnauba wax, further comprising:
      embossing a plurality of grooves into the embossable mixture layer;
      depositing metal into the embossed grooves;
      removing excess metal to leave wiring traces;
      coupling one or more electronic chips to the metal wiring; and
      coupling one or more external electrical connections to the metal wiring,
      wherein depositing a film of an embossable mixture that includes a composition ratio of approximately:
   210 parts of methyl ethyl ketone;
   20 parts of diglycidyl Bisphenol-A;
   20 parts of tetrabromo Bisphenol-A;
   20 parts of ortho-cresol novolak epoxy resin (215 g/eq);
   15 parts of epoxy-terminated polybutadiene rubber;
   50 parts of brominated phenolic novolak resin;
   4 parts of 2,4-diamino-6-(2-methyl-1-imadizolylethyl)-1,3,5-triazine.isocyanuric acid adduct;
   11 parts of silica (maximum particle size of 5 microns); and
   1 part of carnauba wax.

* * * * *